US006200651B1

(12) United States Patent
Roche et al.

(10) Patent No.: US 6,200,651 B1
(45) Date of Patent: Mar. 13, 2001

(54) METHOD OF CHEMICAL VAPOR DEPOSITION IN A VACUUM PLASMA PROCESSOR RESPONSIVE TO A PULSED MICROWAVE SOURCE

(75) Inventors: Gregory A. Roche, Sunnyvale; William R. Harshbarger, San Jose, both of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 08/885,864

(22) Filed: Jun. 30, 1997

(51) Int. Cl.$^7$ ........................................ H05H 1/30
(52) U.S. Cl. .............................. 427/571; 427/575
(58) Field of Search ............................. 427/458, 547, 427/571, 579, 575; 118/723 R, 723 MW, 723 MR, 723 E

(56) References Cited

U.S. PATENT DOCUMENTS

| | | | |
|---|---|---|---|
| 4,891,118 | * | 1/1990 | Ooiwa et al. ................. 118/723 MR |
| 4,970,435 | * | 11/1990 | Tanaka et al. ............... 118/723 MR |
| 5,114,770 | * | 5/1992 | Echizen et al. ................... 427/575 |
| 5,310,452 | * | 5/1994 | Doki et al. ................... 118/723 MP |
| 5,332,441 | * | 7/1994 | Barnes et al. ................. 118/723 I |
| 5,453,305 | * | 9/1995 | Lee ............................... 118/723 MR |
| 5,626,922 | * | 5/1997 | Miyanaga et al. ................ 427/576 |
| 5,643,638 | * | 7/1997 | Otto et al. ........................ 427/576 |
| 5,723,386 | * | 3/1998 | Ishikawa ........................... 427/579 |
| 5,827,435 | * | 10/1998 | Samukawa ................. 118/723 MW |

OTHER PUBLICATIONS

Seiji Samukawa, et al., "Pulsed–time–modulated Electron Cyclotron Resonance Plasma Discharge for Highly Selective, Highly Anisotropic, and Charge–free Etching," J.Vac. Sci. Technol. A 14(6), Nov./Dec. 1996, 1996 American Vacuum Society, pp. 3049–3058.

Sumio Ashida, et al., "Time Modulated Operation of High Density Plasma Sources.", 1995 Dry Process Symposium, pp. 21–26.

A. Yokozawa, et al., "Simulation for Afterglow Plasma in Time–modualted $CI_2$ Plasma," 1995 Dry Process Symposium, pp. 27–32.

(List continued on next page.)

Primary Examiner—Shrive Beck
Assistant Examiner—Bret Chen
(74) Attorney, Agent, or Firm—Lowe Hauptman Gopstein Gilman & Berner, LLP

(57) ABSTRACT

A dielectric layer is deposited on a workpiece by a chemical vapor deposition method in an electron cyclotron resonance vacuum plasma processor having a plasma chamber responsive to a repetitively pulsed microwave field and gases from a plasma source. A reaction chamber responds to at least one reacting gas containing at least one element that chemically reacts in the presence of the plasma with at least one element in at least one of the gases from the plasma source to form the deposited layer on the workpiece. The turn off periods are long enough to cause electrons in the plasma on the deposited dielectric layer to be cooled sufficiently (from about 3.5 eV to a lower value having a minimum value of about 0.1 eV) to reduce the tendencies for opposite polarity charges to be established across the deposited dielectric layer and for damaging discharge current to flow across the deposited dielectric layer. The layer is deposited in a gap having an initial aspect ratio of at least about 1:1; the turn on and turn off times are such as to cause the gap to be bridged by a different deposited film each time the microwave energy is turned on. The films build up to form a layer. The turn off time is greatest during initial deposition of the layer and becomes zero as the gap is filled. The peak power per pulse and the time between pulses are controlled.

46 Claims, 1 Drawing Sheet

OTHER PUBLICATIONS

H. Sugai, et al., "Diagnostics and Control of Radicals in an Inductively Coupled Etching Reactor," J.Vac. Sci. Technol A 13(3), May/Jun. 1995, 1995 American Vacuum Society, pp. 887–893.

Seiji Samukawa, Time–Modulated Electron Cyclotron Resonance Plasma Discharge for Controlling the Polymerization in $SiO_2$ Etching, Jpn. J. Appl. Phys., vol. 32 (1993) pp. 6080–6087, Part 1, No. 12B, Dec. 1993.

Journal of Vacuum Science & Technology B; Microelectronics and Nanometer Structures, Second series, vol. 12, No. 6, Nov./Dec. 1994. pp. 3300–3304.

Hiroto Ohtake & Seiji Samukawa, Microloading–Free Si Trench Etching in Pulse–Time Modulated ECR Plasma With 600 kHz RF Bias, 1995 Dry Process Symposium. pp. 45–49.

Seiji Samukawa and Kazuo Terada, Pulse Time Modulated ECR Plasma Etching for Highly Selective, Highly Anisotropic and Less–Charging Poly–Si Gate Patterning, Microelectronics Research Laboratories, NEC Corporation 34 Miyukigoaka Tsukuba, Ibaraki 305, Japan, 1994 Symposium on VLSI Technology Digest of Technical Papers pp. 27–28.

N. Kofuji et al., Sub–Quarter Micron Poly–SI Etching With Positive Pulse Biasing Technique, Central Research Laboratory, Hitachi Ltd., 1996 1st International Symposium on Plasma Process–Induced Damage, May 13–14, 1996 American Vacuum Society. pp. 234–236.

Seiji Samukawa, Highly Selective and Highly Anisotropic $SiO_2$ Etching in Pulse–Time Modulated Electron Cyclotron Resonance Plasma,, Jpn J. Appl., Phys. vol. 33 (1994) pp. 2133–2138.

Nobuo Fujiwara et al., Pulse Plasma Processing for Reduction of Profile Distortion Induced by Charge Build–up in ECR Plasma, 1995 Dry Process Symposium. pp. 51–56.

K. Hashimoto et al., Reduction of Electron Shading Damage by Using Synchronous Bias in Pulsed Plasma, 1995 Dry Process Symposium. pp. 33–37.

Shigenori Sakamori et al., Reduction of Electron Shading Damage with Pulse–Modulated ECR Plasma, 1997 2nd International Symposium on Plasma Process–Induced Damage. pp. 55–58.

* cited by examiner

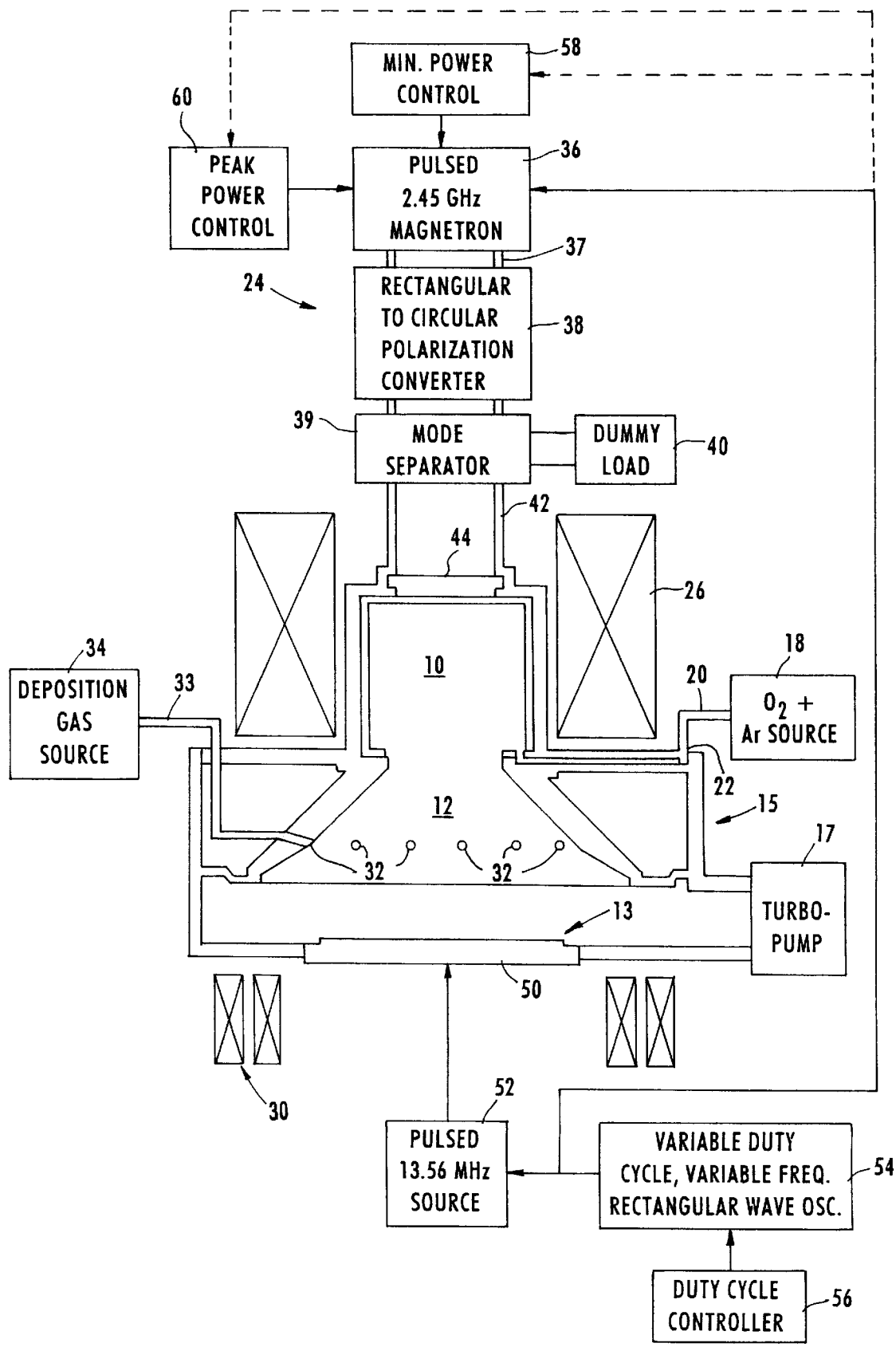

METHOD OF CHEMICAL VAPOR DEPOSITION IN A VACUUM PLASMA PROCESSOR RESPONSIVE TO A PULSED MICROWAVE SOURCE

FIELD OF INVENTION

The present invention relates generally to electron cyclotron resonance (ECR), chemical vapor deposition (CVD) processes and apparatuses in vacuum plasma processors and more particularly to such a method and apparatus wherein layers are deposited on a workpiece by a plasma excited by a pulsed microwave source.

BACKGROUND ART

One known apparatus for depositing films, particularly dielectric films, on workpieces, such as dielectric substrates, semiconductor wafers or metal substrates includes a vacuum plasma processor enclosure wherein a plasma gas supplied to a plasma chamber of the enclosure is excited to a plasma by a continuous, i.e. non-pulsed, microwave field. Ions in the resulting plasma chemically react with ions and other particles of at least one other element introduced into a reaction chamber to form deposited layers on the workpiece. The microwave field interacts with a DC magnetic field having lines of flux generally aligned and coaxial with a longitudinal axis of the microwave field. The frequency of the microwave field and intensity of the DC magnetic field cause an electron cyclotron resonance phenomenon in the reaction chamber. The workpiece is usually mounted on a holder; if the workpiece is non-metallic the holder is typically an electrostatic chuck including an electrode usually supplied with DC chucking voltage and an r.f. bias having a frequency such as 4.0 or 13.56 MHZ.

The microwave field interacts with electrons spiraling in the DC magnetic field to produce a high-density plasma when the vacuum chamber is maintained at a pressure of less than about 10 milliTorr. The electron cyclotron resonance arrangement increases ion production at these low gas pressures by efficiently coupling microwave energy to the plasma gas. At electron resonance, as established by the frequency of the microwave source and the DC magnetic field intensity, electrons in the plasma orbit the DC magnetic field lines at the same frequency as the microwave field. The electrons continuously gain energy from the microwave field and are accelerated with a circular motion about the microwave field axis, which is coincident with an axis of a source of the DC magnetic field, such as a solenoid coil. The DC magnetic field inhibits plasma electrons from losing energy to walls of the processor chamber, to increase the probability of ionization of elements in the plasma.

In one prior art arrangement, the DC magnetic field is 875 Gauss and the microwave field has a frequency of 2.45 gigahertz, derived by a magnetron and supplied to a first end of the plasma chamber via a matching network, a wave guide and a window. Typically, the plasma gas is a mixture of oxygen and an inert gas, such as argon. At a second end of the plasma chamber, opposite the first end thereof, electrons and ions escape from the plasma chamber into the reaction chamber. The electrons escape from the plasma chamber into the reaction chamber before the ions.

The electrons and ions pass through the reaction chamber. Exemplary gases supplied to the reaction chamber are a silane, such as $SiH_4$, or a silane mixed with phosphine ($PH_3$), tetrafluorosilane ($SiF_4$) or nitrogen ($N_2$). The chemical reaction takes place on the workpiece primarily between ions, typically $O_2^-$, escaping from the plasma chamber and molecules in, as well as ions dissociated from, the gases flowing into the reaction chamber, e.g. $Si^+$, $SiH^+$, $SiH_2$, and $SiH_3$.

Downstream of the reaction chamber, electrons and positive ions in the plasma are incident on the substrate. The silicon introduced into the reaction chamber and the oxygen ions dissociated from the plasma source gas combine on the workpiece, i.e., substrate, to form silicon dioxide layers which sometimes are doped with phosphorous, fluorine, or nitrogen, depending on the gases introduced into the reaction chamber.

There is a measurable nonuniform charge build up on dielectric layers being formed by the CVD process in gaps with relatively high height to width aspect ratios of at least 1:1. This charge build up is due to a disparity between the trajectories of the ions and electrons. This difference in trajectories is due to the large disparity in mass between ions and electrons, when exposed to an applied radio frequency electromagnetic field. The electrons are mobile enough to follow the applied r.f. field. The ions are not. This results in the dielectric layers being CVD formed acquiring charge separation, which then creates a net negative DC bias (also called applied bias) on the dielectric layer being formed. The net negative DC bias is with respect to the plasma, which usually has a voltage close to ground. The positive ions in the plasma see this negative bias and are accelerated to the surface of the dielectric layer being formed. The positive ion trajectories are very directional normal to the exposed layer surface because of this bias. As a result, positive ions accumulate on the bottom of a topographical structure, such as a trench or high aspect ratio dielectric layer. The electrons, on the other hand, being less directional, tend to collect at the tops of the topographical structure.

This separation in charge between the electrons at the top of the layer and the positive ions at the bottom of the layer can cause a destructive Fowler-Nordheim current to flow through the layer, its underlying active semiconductor device structure, and the substrate. The circuit is completed by current flowing back up to the plasma at some other location on the workpiece. This current flow through an active semiconductor device underlying the dielectric layer being found causes degradation of a gate oxide in a metal oxide semiconductor (MOS) device of the underlying structure.

It is, accordingly, an object of the present invention to provide a new and improved method of and apparatus for chemically vapor depositing materials in a vacuum plasma processor responsive to a plasma established by an electron cyclotron resonance mechanism.

Another object of the invention is to provide a new and improved method of and apparatus for electron cyclotron resonance chemical vapor depositing layers on a workpiece to provide a dielectric film or layer formed in such a manner as to substantially obviate the tendency for charge separation to occur in the formed film or layer between separated positive ions and electrons in the layer.

A further object of the invention is to provide a new and improved chemical vapor deposition method of and apparatus for depositing dielectric materials in a vacuum plasma processor wherein the plasma of the processor is excited by an electron cyclotron resonance mechanism energized in such a manner as to reduce damage due to separation of positively charged ions and electrons on opposite portions of the formed dielectric film.

An additional object of the invention is to provide a new and improved ECR, CVD method of and apparatus for forming layers in a high aspect ratio gap on a workpiece, wherein the compound in the gap has high uniformity.

SUMMARY OF THE INVENTION

In accordance with one aspect of the invention microwave energy supplied to a plasma chamber of a CVD, ECR processor is repetitively pulsed, e.g. between maximum and minimum power levels. A homogeneous layer is thereby deposited on a workpiece in the processor. The plasma chamber, in addition to being responsive to the pulsed microwave energy, is responsive to gases from a plasma source. The processor includes a reaction chamber responsive to at least one reacting gas containing at least one element that chemically reacts in the presence of the plasma with at least one element in at least one of the gases from the plasma source to form the deposited layer on the workpiece.

In a preferred embodiment, the layer is a dielectric and the turn off or minimum power level periods are long enough to cause electrons in the plasma on the deposited dielectric layer to be cooled sufficiently to reduce the tendency for opposite polarity charges to be established across the deposited dielectric layer and reduce the tendency for damaging discharge current to flow across the deposited dielectric layer. We have found the microwave energy preferably has a minimum power level for a time period sufficient to cause the electrons to cool from about 3.5 eV to lower level having a minimum value of about 0.1 eV, after which the microwave energy is again turned on.

According to another aspect, the layer is not necessarily a dielectric and is deposited in a gap having an initial aspect ratio of at least about 1:1, and the minimum and maximum power level times are such as to cause the gap to be bridged by the deposited layer each time the microwave energy is turned on and off.

In a preferred embodiment the microwave energy turn off or minimum power level time is greatest during initial deposition of the deposited layer. The microwave energy turn on time may gradually increase as the deposited dielectric layer increases in thickness. The microwave energy may be continuously supplied to the plasma chamber after the deposited dielectric layer has been initially deposited, to completely fill the gap at a greater deposition rate.

Control of the microwave and therefore plasma off time will allow chemical reactions to take place in the absence of bias applied to the substrate. For example, with the case of a fluorosilica glass (FSG) deposition, it was observed that chemical etching (from free F) took place during the pulse off time. This chemical etch was more anisotropic than isotropic sputtering that occurred under the applied bias. This is useful for gap fill in some structures, where the metal layer being coated by the FSG has a very high sputter yield.

Control of the plasma average power by varying the duty cycle, and hence average power, per pulse would appear to enable separation of gas phase and surface chemistry effects to control the material in the formed films particularly, in phosphine ($PH_3$). Experiments show that with a continuous microwave field there is a limit of how much P can be incorporated into a film growing with the $SiH_4$ and $O_2$ chemistries in the ECR reactor; 20% $PH_3$ in $SiH_4$ only yields 2% P in the $SiO_2$. We believe the higher peak power per pulse available with the pulsed microwave field (with no increase in average power over a continuous microwave field) further dissociates the $PH_3$ molecule so it is more chemically active, and thereby is more completely incorporated into the growing film.

Hence another important potential application for pulsed microwave plasmas appears to involve increasing the doping of phosphosilicate glass, PSG, by the oxidation of silane, $SiH_4$, and phosphine, $PH_3$. Pulsing the microwave field applied to the plasma appears to enable more P to be efficiently incorporated into the PSG film. The pulsed plasma seems to permit the more efficient dissociation of $PH_3$ into radicals and ions relative to $SiH_4$, thus increasing the P dopant in the deposited PSG.

Hence, it appears to be desirable to control one or more of (1) the peak microwave power per pulse, (2) the minimum microwave power between the peak pulsed power (i.e. to control the microwave power so it does not drop to zero), (3) average power per pulse, and (4) the time between microwave pulses by varying one or both of the pulse frequency and duty cycle. Controlling the average and peak microwave powers per pulse and the minimum microwave power between the peak pulsed power is a function of the materials in the layers to be formed and dependent on the gases supplied to the plasma and reaction chambers. Different species in the plasma formed from the gases supplied to the plasma and reaction chambers dissociate to a greater or lesser extent as a function of applied microwave power. Consequently layers of certain materials will be formed by the CVD process by increasing the peak microwave power per pulse to e.g. 20 kW. Some species will react at a relatively low power of e.g. 500 watts, between the peak power at the pulses. In this way, the composition of the layers can be tailored for different specifications. As the peak and minimum powers are changed, it may be necessary to change the time interval between adjacent pulses to obtain the cooling necessary to prevent damaging current flow. Further, the minimum power level can change as a function of the thickness of the deposited layer, so that, e.g. the minimum power is zero when the layer is initially being deposited and then increases as the layer deposition time increases.

Another potential use of applying a pulsed microwave field to the gases supplied to the plasma and reaction chambers is for nitridation of gate oxides to prevent diffusion of boron or other dopants into an active gate region of a metal oxide field effect device. Experiments have been conducted in which a continuous nitrogen ECR plasma (with no r.f. basis applied to the substrate) was used to attempt to nitride the top surface of a gate oxide to form a diffusion barrier. However, this technique was not successful due to damage of the gate oxide. However, a pulsed nitrogen ECR plasma could generate the active species for nitridation with substantially less damage of the gate oxide.

The workpiece is preferably on an r.f. biased electrode, while the layer is being deposited. The r.f. applied as bias to the electrode may be turned on and off simultaneously with the microwave energy having the maximum and minimum power levels.

Another aspect of the invention relates to an apparatus for depositing a layer on a workpiece, wherein the apparatus comprises: a source of plasma forming gases; a source of at least one gas containing at least one element that can chemically react with at least one element of the plasma forming gases; a vacuum plasma enclosure; a microwave source arranged to be repetitively pulsed, and a DC magnetic field source. The vacuum plasma enclosure includes: a plasma chamber connected to be responsive to the source of plasma forming gases, a reaction chamber connected to be responsive to the source of at least one gas that can chemically react with at least one element of the plasma to form the layer on the workpiece, and a workpiece holder. The pulsed microwave source is coupled with the plasma chamber and is arranged to supply the plasma chamber with a pulsed microwave field having sufficient power to convert the gas of the plasma source into a plasma. The DC magnetic field source is coupled with the vacuum plasma enclosure and the microwave field for establishing an electron cyclotron resonance mechanism in free ions and electrons of the plasma. The free ions and electrons chemically react to form the layer on the workpiece.

To provide greater uniformity in the deposited film and eliminate the need for a matching network in the pulsed microwave source, i.e. between a pulsed magnetron and waveguide feeding a window in the plasma chamber, the source is arranged to supply the plasma chamber with microwave energy that is circularly polarized in only one direction. Right hand polarization has been found to substantially reduce microwave reflections in the chamber.

We are aware of prior art in "Time-Modulated Electron Cyclotron Resonance Plasma Discharge for Controlling the Polymerization in $SiO_2$ Etching," *Japanese Journal of Applied Physics,* December 1993, Vol. 32, No. 12T, pages 6080–6087 (Samukawa) and "Pulse-time Modulated Electron Cyclotron Resonance Plasma Etching for Highly Selective, Highly Anisotropic, and Less-Charging Polycrystalline Silicon Patterning," *J.-Vac. Sci. Technol.* Serial No. 08/885.864 B 12(6), November–December 1994, pages 3300–3305 (Samukawa et al.) wherein microwave sources have been pulsed on and off in electron cyclotron resonance vacuum plasma etching processes. This prior art reports etching of polysilicon and how an on and off pulsed microwave source increases the selectivity of polysilicon to silicon dioxide, with suppressed "charge buildup damage." Kofuji et al., "Sub-Quarter Micron Poly-Si Etching with Positive Pulse Biasing Technique," *1st International Symposium on Plasma Process-Induced Damage,* May 1996, pages 234–236 discloses an electron cyclotron resonance plasma etching system wherein on and off pulsed r.f. bias is supplied to a substrate.

The prior art of which we are aware deals with etching dielectrics and is not concerned with forming films, particularly dielectric films, and the problems associated therewith; nor is it concerned with forming uniform composition films in high aspect ratio gaps. Frequently, it is necessary to fill relatively high aspect ratio gaps or grooves, i.e., the height of a gap to be filled between a pair of adjacent walls exceeds the width of the gap. We have information showing such gaps can be substantially completely uniformly filled by the pulsed microwave ECR, CVD process and apparatus of the present invention, and that the invention overcomes the tendency for dielectric layers and the structures underlying such layers to be damaged by the charge separation mechanism.

The use of a pulsed microwave source in electron cyclotron resonance deposition appears to be advantageous because Langmuir data of an argon plasma shows that the average ion current density is higher in a pulsed microwave system than in a continuously operated microwave system for a given average power. Therefore, it appears that the same deposition rates can be achieved with a lower pulsed microwave average power level than for a higher continuous microwave average power level. Further, because there is a modified high density plasma produced by the pulsed microwave source, the pulsed plasma appears to aid in the deposition of fluorosilica glasses (FSG), relative to the application of a continuous wave microwave field to the plasma. The pulsed microwaves appear to reduce the amount of argon incorporated into a deposited film. Pulsing appears to provide a more uniform film composition in depositing layers in high aspect ratio grooves or gaps than is attained by applying a continuous microwave source to the plasma.

The above and still further objects, features and advantages of the present invention will become apparent upon consideration of the following detailed description of a specific embodiment thereof, especially when taken in conjunction with the accompanying drawing.

BRIEF DESCRIPTION OF THE DRAWING

The sole figure is a schematic diagram of a preferred embodiment of an ECR, CVD plasma processor responsive to a pulsed microwave source for performing the method of the present invention.

DESCRIPTION OF THE PREFERRED EMBODIMENT

Reference is now made to the figure, a partially schematic and partially cross-sectional view of an electron cyclotron resonance (ECR) chemical vapor deposition (CVD) vacuum processor including cylindrical electron resonance plasma chamber 10, frustoconical reaction chamber 12 and workpiece holder 13, all forming or located in a single non-magnetic sealed enclosure 15, pumped to a vacuum by turbo-pump 17. Plasma gas source 18 supplies a mixture of oxygen and argon to plasma chamber 10 via conduit 20 and port 22 in enclosure 15. The gaseous mixture flowing through port 22 combines with a pulsed microwave (preferably 2.45 gigahertz) electromagnetic field derived by source 24 and a DC magnetic field (preferably 875 Gauss) derived by cylindrical, solenoidal coil 26. The lines of DC magnetic flux derived by coil 26 (located outside of and coaxial with plasma chamber 10) extend axially through plasma chamber 10. The DC magnetic field magnitude and the orientation and frequency of the microwave field produced by source 24 in chamber 10 are such that charge carriers (electrons and ions) plasma source 30 supplies to chamber 10 rotate about the axis of the plasma chamber. The angular frequency of electrons in plasma chamber 10 due to the magnetic field established by coil 26 matches the microwave frequency of pulse source 24, to establish the electron cyclotron resonance phenomenon. Electrons gain energy from the microwave field and are accelerated with a circular motion.

The DC magnetic field established by coil 26 extracts ions out of plasma chamber 10 into reaction chamber 12 and onto a workpiece, that can be a dielectric (e.g. a flat panel display), a semiconductor (e.g. a wafer) or a metal (e.g. a plate), mounted on holder 13. Because the ends of coil 26 and the intersection of chambers 10 and 12 are approximately aligned the magnetic field established by coil 26 begins to diverge at the intersection so the plasma flowing from plasma chamber 10 into reaction chamber 12 has a tendency to be cone shaped. The ions in the plasma produced in chamber 10 follow the diverging magnetic flux liner, established by the magnetic field as the ions follow the diverging flux lines and spiral from chamber 10 into chamber 12 and onto the substrate on holder 13. The divergent magnetic field established by coil 26 also creates a force pulling on electrons in the plasma, so the electrons are pulled out of the magnetic field. The resulting potential established by the electrons attracts ions to form a variable directional ion beam in reaction chamber 12 and on the workpiece on holder 13. The magnetic field and plasma flow direction are shaped by cylindrical mirror and cusp coils 30, outside enclosure 15 below substrate holder 13 and coaxial with coil 26.

Vacuum enclosure 15 is operated at pressures in the relatively low range of 0.5 to 10 milliTorr to establish a high density plasma in chambers 10 and 12 and on the workpiece on holder 13. The density of ions to neutral particles on the workpiece is as high as 1:100 with in excess of $1\times10^{12}$ ions per cubic centimeter.

Reaction chamber 12 includes multiple ports 32, located about the periphery of the reaction chamber, in proximity to the reaction chamber open end, fairly close to substrate holder 13, i.e., remote from the end of the reaction chamber intersecting plasma chamber 10. Ports 32 are supplied via conduit 33 and a suitable manifold (not shown) with one or more deposition gases from one or more sources, shown collectively as source 34. Ions in some of the gases of source 34 chemically react on the workpiece with ions from plasma source 30 to form dielectric or other films on the workpiece. To form dielectric films of silicon dioxide, source 34 is preferably silane ($SiH_4$) or silicon tetrafluoride ($SiF_4$).

In response to the plasma in chamber 12 the hydrogen or fluorine dissociates from the silicon. The dissociated fluorine forms positive and negative ions ($F^+$ and $F^-$) to dope the $SiO_2$ film formed by the chemical reaction on the substrate of $O_2$ molecules and $O_2^-$ ions in the plasma with silicon dissociated from the $SiF_4$. To form other types of dopant layers on the substrate carried by holder 13, a gas including a dopant, such as phosphine, is included in source 34 and supplied to chamber 12.

The gases of source 34 are, in certain embodiments, gases which enable formation of dielectrics having dielectric constants of less than 3.5 (frequently referred to in the art as ultra low K dielectrics) on the substrate carried by substrate holder 13. Under these conditions, source 34 includes carbon fluoride gaseous compounds, such as the compounds which react with at least one of the plasma gases to form fluorocarbons. The carbon fluoride compounds chemically react on the substrate with at least one of the plasma gases to form amorphous films including carbon.

Because microwave source 24 is pulsed the gases of source 34 chemically react on the substrate with the oxygen supplied by source 18 to reaction chamber 10 to form multiple films which are built up to form a layer. For high aspect ratio gaps, it is believed that the space between adjacent walls of the gap is filled with a very thin film of the desired composition each time the microwave source is pulsed on and then off or pulsed to a maximum power and to a minimum, non-zero power level. The compound in the deposited film spreads between the gap walls during the interval while the microwave source is off. Hence, pulsing microwave source 24 is advantageous to substantially completely and uniformly fill a desired composition into high aspect ratio gaps or grooves between adjacent walls of metal, semiconductor or dielectric layers on the substrate. In other words, pulsing microwave source 24 improves the topography of an integrated circuit on the substrate.

Preferably, source 14 is pulsed at the beginning of formation of dielectric films on the substrate, for example, during the first 10 to 20 percent of the film formation. During the remainder of the dielectric film formation process, the microwave source can be operated as a continuous wave source or there can be a gradual transition and increase in duty cycle of the microwave source as the deposition process proceeds beyond the 10 to 20 percent initial processing interval. For example, the microwave duty cycle can be initially 50% and increase gradually or in steps and become 100% when the gap is about half filled. Increasing the duty cycle results in successive films of the layer having greater thicknesses. As the gap becomes filled the gap aspect ratio decreases and the likelihood of having a void in the formed film decreases, so thicker films can be laid down. Increasing the microwave duty cycle and then continuously filling the gap by operating microwave source 24 continuously after the gap has been filled to a certain percentage enables more rapid filling than is achieved by only operating microwave source 24 in the pulsed mode.

In a preferred embodiment, microwave source 24 includes pulsed magnetron 36, having a maximum continuous wave output power of approximately 2.5 kW. The 2.45 gigahertz electromagnetic energy derived by magnetron 36 has a rectangular propagation mode and is supplied by rectangular waveguide 37 to rectangular to circular polarization converter 38 and mode separator 39, which together convert the rectangularly polarized output of the magnetron into left and right hand circularly polarized waves. The left hand polarized wave is supplied to dummy load 40 while the right hand polarized wave is supplied to circular wave guide 42, configured to operate in the $TE_{11}$ mode. The right hand circularly polarized microwave energy propagating through wave guide 42 is supplied through microwave window 44 to the top of plasma chamber 10, i.e., the end of chamber 10 remote from the intersection of the plasma chamber and reaction chamber 12. Converting the rectangularly polarized output of magnetron 36 into a circularly polarized wave having only right hand polarization avoids the need for a matching network between the magnetron and plasma chamber 10 and improves the uniformity of films deposited on the workpiece on holder 13. Despite the lack of a matching network, there is a low level of microwave reflection in plasma chamber 10 and reaction chamber 12, resulting in a relatively low voltage standing wave ratio (VSWR).

The dielectric and semiconductor workpieces are preferably held on holder 13 by an electrostatic chuck structure (not shown) energized by a DC source (not shown). The substrate holder includes metal plate 50 forming an electrode to which the workpiece is chucked. An AC bias voltage, preferably having a frequency of 13.56 MHZ, is applied by source 52 to electrode plate 50. A suitable power level for source 52 is 2 kW. The substrate is cooled by helium and a cooling liquid, derived from suitable sources (not shown) and supplied in a conventional manner by suitable conduits (not shown) to holder 13.

In a preferred embodiment, r.f. source 52 is pulsed on and off synchronously with pulsing of magnetron 36 under the control of programmed variable duty cycle, variable frequency pulse oscillator 54 so the r.f. and microwave sources are simultaneously on and off. Duty cycle controller 56 controls the duty cycle of oscillator 54 and therefore sources 24 and 54 so the microwave field and the r.f. applied to electrode 50 initially have 50% duty cycles. Controller 56 preferably increases the duty cycle to 100%, gradually or in steps. Controller 56 controls the duty cycle of oscillator 541 to achieve any of the different duty cycles mentioned previously. The frequency of oscillator 54 is controlled by an operator for the various duty cycles to assure adequate cooling of the deposited layer from about 3.5 eV to a lower value, no greater than about 0.1 eV, to substantially prevent charge separation and flow of destructive Fowler-Nordheim tunneling current, as discussed supra.

An acceptable range for the frequency of oscillator 54, and therefore the pulsing frequency of microwave source 24 and r.f. source 52, has been found to be between 5 kHz and 20 kHz; tests were conducted at 5 kHz, with a 50% duty cycle, 8 kHz with 60%, 70%, 80% and 90% duty cycles, 10 kHz with a 50% duty cycle and 20 kHz with a 50% duty cycle. In some of these tests r.f. bias was applied to substrate electrode plate 50 while no r.f. was applied in some other tests. At an 8 kHz pulse rate, the lowest duty cycle for the r.f. bias was found to be 50%; adjustment of an r.f. matching network (not shown) between source 52 and electrode 50 is unstable at pulse frequencies less than 8 kHz and duty cycles less than 50%. At 8 kHz for 70%, 80% and 90% duty cycles of magnetron 36, with 900 watts being continuously applied to electrode 50 (i.e. with no connection from oscillator 54 to source 52), and an average microwave power of 1000 watts being supplied to plasma chamber 10 while a semiconductor wafer workpiece was maintained at a temperature of 330° C., a $SiO_2$ layer was deposited with a 1–1.5% uniformity across the wafer. The $SiO_2$ film had a dielectric constant of about 3.6; the layer was formed by feeding $SiH_4$ from source 34 to openings 32 while $O_2$ and Ar were supplied by source 18. The experimental data show the pulsed microwave source can provide a much higher height to depth aspect ratio without significant voids than can be obtained with a continuous microwave source.

Pulsing the microwave source has the disadvantage of considerably reducing the deposition rate for the same peak microwave power. Average applied power for the pulsed microwave source is typically about 40% less than that of the continuous microwave power. The decrease in deposition rate for the pulsed microwave source makes increasing the duty cycle important as the gap is being filled during the deposition process.

Pulsing the microwave source, in addition to attaining improved topography, significantly reduces damage to deposited dielectric layers and the structure underlying the layers. If the microwave source were continuously operated, positive ions would be accumulated at the bottom face of a topographical structure. While ions are accumulated at the bottom face of the topographical structure, electrons are accumulated at the top face of the topographical structure during continuous application of the microwave field. The accumulation of oppositely charged particles on the top and bottom of the topographical structure results in a Fowler-Nordheim current through the layer and a structure underlying the layer, causing damage to the layer and the underlying structure.

Pulsing the microwave source appears to significantly reduce damage to the formed layer and the structure underlying the layer. The off time of the microwave energy as given, e.g. by the foregoing examples, allows the electrons to cool from about 3.5 eV to a lower value, no lower than about 0.1 eV. We believe this cooling enables the electron attachment cross-section to increase sufficiently to increase the number of negative ions in the plasma. Since the negative ions accumulate at the bottom of the film, the plasma charge non-uniformity across the dielectric decreases to substantially reduce or prevent destructive Fowler-Nordheim tunneling current flow across the layer thickness. By pulsing the microwave source and the r.f. bias voltage applied to electrode 50, the plasma sheath on the workpiece surface may collapse to allow for charge redistribution on the workpiece exposed surface. The charge redistribution seems to eliminate the accumulation of opposite polarity charges on the opposite sides, i.e. faces, of the deposited film and prevent the flow of destructive Fowler-Nordheim tunneling current through the layer and device structure underlying the layer.

In one embodiment, the maximum or peak power of the microwave pulses is adjustable by an operator, as is the minimum power of the pulses, i.e., here can be a controllable non-zero power level between the maximum microwave power levels during each complete cycle of oscillator 54. Such adjustments control the average microwave power applied to the plasma. To this end, magnetron 36 is coupled with minimum output power controller 58 and peak output power controller 60, both driven by oscillator 54, as indicated by the dash lines between the oscillator and controllers. During the low level portion of each cycle of oscillator 54, controller 58 sets the input and therefore output powers of magnetron 36 to an appropriate minimum level set by an operator. During the high level portion of each cycle of oscillator 54, controller 60 sets the input and therefore the output powers of magnetron 36 to an appropriate maximum level set by the operator. The operator sets the minimum and peak powers of controllers 58 and 60 as a function of the materials to be deposited in the films forming the layer to be deposited on the workpiece. The operator also sets limit values for the durations of the minimum and peak power levels by adjusting one or both of the duty cycle and frequency of oscillator 54 so there is adequate cooling of the formed films between the peak output power periods of magnetron 36, bearing in mind that the amount of required cooling is determined, inter alia, by the peak and minimum powers.

While there has been described and illustrated one specific embodiment of the invention, it will be clear that variations in the details of the embodiment specifically illustrated and described may be made without departing from the true spirit and scope of the invention as defined in the appended claims. For example, the frequency of r.f. bias source 52 could be suitable values, e.g. 4.0 MHZ or 700 kHz.

What is claimed:

1. A chemical vapor deposition method of depositing a dielectric layer on a workpiece in an electron cyclotron resonance vacuum plasma processor having a plasma chamber and a reaction chamber, the method comprising forming a plasma by supplying microwave energy and gases from a plasma source to the plasma chamber while at least one reacting gas is supplied to the reaction chamber, chemically reacting at least one element of the at least one reacting gas with at least one element in at least one of the gases of the plasma as derived from the plasma source to form the deposited layer on the workpiece, and repetitively pulsing the microwave energy supplied to the plasma chamber to maximum and minimum power levels while the gases from the plasma source and the reacting gas are in the reaction chamber, the minimum power level periods being long enough to cause electrons in the plasma on the deposited dielectric layer to be cooled sufficiently to reduce the tendency for opposite polarity charges to be established across the deposited dielectric layer and reduce the tendency for destructive Fowler-Nordheim tunneling current to flow across the deposited dielectric layer.

2. The chemical vapor deposition method of claim 1 wherein the microwave energy has a minimum power level for a time period sufficient to cause the electrons to cool from about 3.5 eV to a lower level having a maximum value of about 0.1 eV.

3. The chemical vapor deposition method of claim 2 wherein the deposited layer is a dielectric including $SiO_2$ and the plasma gases include oxygen and an inert gas, and the reacting gas includes a silane gas compound that dissociates in the plasma to form silicon that reacts with the oxygen to form the deposited layer.

4. The chemical vapor deposition method of claim 3 wherein the $SiO_2$ in the deposited layer is doped with a dopant agent and the reactant gas includes the dopant agent.

5. The chemical vapor deposition method of claim 1 wherein the layer is deposited in a gap having an initial aspect ratio of at least about 1:1, the maximum and minimum power levels being such as to cause the gap to be bridged by a different deposited film each time the microwave energy is pulsed to the maximum and minimum power levels.

6. The chemical vapor deposition method of claim 5 wherein the microwave energy minimum power level duration is greatest during initial deposition of the deposited layer.

7. The chemical vapor deposition method of claim 6 wherein the microwave energy maximum power level duration gradually increases as the deposited dielectric layer increases in thickness.

8. The chemical vapor deposition method of claim 6 wherein the microwave energy is continuously supplied to the plasma chamber after the deposited dielectric has been initially deposited in response to initial pulsing of the microwave energy during deposition of the same layer.

9. The chemical vapor deposition method of claim 1 wherein the layer is deposited while the processor is operated to have a pressure in the range of 0.5 to 10 millitorr.

10. The method of claim 1 wherein the duration and amplitude of the minimum power level are such as to maintain the electrons in the plasma at a temperature of at least 0.1 eV.

11. The method of claim 10 wherein the minimum power level is greater than zero.

12. A chemical vapor deposition method of depositing a layer on a workpiece in an electron cyclotron resonance vacuum plasma processor having a plasma chamber and a reaction chamber, the method comprising forming a plasma by supplying microwave energy and gases from a plasma source to the plasma chamber while at least one reacting gas is supplied to the reaction chamber, chemically reacting at least one element of the at least one reacting gas with at least one element in at least one of the gases of the plasma as derived from the plasma source to form a deposited layer on the workpiece, and repetitively pulsing the microwave energy supplied to the plasma chamber to maximum and minimum power levels while the gases from the plasma source and the reacting gas are in the reaction chamber, applying r.f. bias to an electrode on which the workpiece is located while the reaction is occurring, the r.f. bias being applied via a matching network, turning the r.f bias applied to the electrode on and off so the microwave energy power level respectively has maximum and minimum levels while the r.f. bias is turned on and off, the on and off times being such that the matching network can be stably adjusted.

13. The chemical vapor deposition method of claim 12 wherein the layer is a dielectric and the minimum power level durations are long enough to cause electrons in the plasma on the deposited dielectric layer to be cooled sufficiently to reduce the tendency for opposite polarity charges to be established across the deposited dielectric layer and reduce the tendency for destructive Fowler-Nordheim tunneling current to flow across the deposited dielectric layer.

14. The method of claim 12 wherein the duration and amplitude of the minimum power level are such as to maintain the electrons in the plasma at a temperature of at least 0.1 eV.

15. The method of claim 14 wherein the minimum power level is greater than zero.

16. A chemical vapor deposition method of depositing a layer on a workpiece in an electron cyclotron resonance vacuum plasma processor having a plasma chamber and a reaction chamber, the method comprising forming a plasma by supplying microwave energy and gases from a plasma source to the plasma chamber while at least one reacting gas is supplied to the reaction chamber, chemically reacting at least one element of the at least one reacting gas with at least one element in at least one of the gases of the plasma as derived from the plasma source to form the deposited layer on the workpiece, and repetitively pulsing the microwave energy supplied to the plasma chamber to maximum and minimum power levels while the gases from the plasma source and the reacting gas are in the reaction chamber so the microwave energy maximum power level duration increases as the deposited layer increases in thickness.

17. The chemical vapor deposition method of claim 16 wherein the microwave energy maximum power level duration gradually increases as the deposited layer increases in thickness.

18. The method of claim 17 wherein the duration and amplitude of the minimum power level are such as to maintain the electrons in the plasma at a temperature of at least 0.1 eV.

19. The method of claim 18 wherein the minimum power level is greater than zero.

20. The method of claim 16 wherein the duration and amplitude of the minimum power level are such as to maintain the electrons in the plasma at a temperature of at least 0.1 eV.

21. The method of claim 20 wherein the minimum power level is greater than zero.

22. A chemical vapor deposition method of depositing a layer on a workpiece in an electron cyclotron resonance vacuum plasma processor having a plasma chamber and a reaction chamber, the method comprising forming a plasma by supplying microwave energy and gases from a plasma source to the plasma chamber while at least one reacting gas is supplied to the reaction chamber, chemically reacting at least one element of the at least one reacting gas with at least one element in at least one of the gases of the plasma as derived from the plasma source to form the deposited layer on the workpiece, and repetitively pulsing the microwave energy supplied to the plasma chamber to maximum and minimum power levels while the gases from the plasma source and the reacting gas are in the reaction chamber so the microwave energy minimum power level duration is greatest during initial deposition of the deposited layer.

23. The method of claim 22 wherein the duration and amplitude of the minimum power level are such as to maintain the electrons in the plasma at a temperature of at least 0.1 eV.

24. The method of claim 23 wherein the minimum power level is greater than zero.

25. A chemical vapor deposition method of depositing a layer on a workpiece in an electron cyclotron resonance vacuum plasma processor having a plasma chamber and a reaction chamber, the method comprising forming a plasma by supplying microwave energy and gases from a plasma source to the plasma chamber while at least one reacting gas is supplied to the reaction chamber, chemically reacting at least one element of the at least one reacting gas with at least one element in at least one of the gases of the plasma as derived from the plasma source to form the deposited layer on the workpiece, and repetitively pulsing the microwave energy supplied to the plasma chamber to maximum and minimum power levels while the gases from the plasma source and the reacting gas are in the reaction chamber so the microwave energy is continuously supplied to the plasma chamber after the deposited material has been initially deposited in response to initial pulsing of the microwave energy during deposition of the same layer.

26. The method of claim 25 wherein the duration and amplitude of the minimum power level are such as to maintain the electrons in the plasma at a temperature of at least 0.1 eV.

27. The method of claim 26 wherein the minimum power level is greater than zero.

28. A chemical vapor deposition method of depositing a layer on a workpiece in an electron cyclotron resonance vacuum plasma processor having a plasma chamber and a reaction chamber, the method comprising forming a plasma by supplying microwave energy and gases from a plasma source to the plasma chamber while at least one reacting gas is supplied to the reaction chamber, chemically reacting at least one element of the at least one reacting gas with at least one element in at least one of the gases of the plasma as derived from the plasma source to form the deposited layer on the workpiece, and repetitively pulsing the microwave energy supplied to the plasma chamber to maximum and minimum power levels while the gases from the plasma source and the reacting gas are in the reaction chamber, depositing the layer in a gap having an initial aspect ratio of at least 1:1, the maximum and minimum power level durations being such as to cause the gap to be bridged by a different deposited film each time the microwave energy is pulsed for the maximum and minimum power levels.

29. The chemical vapor deposition method of claim 28 wherein the microwave energy minimum power level duration is greatest during initial deposition of the deposited layer in the gap.

30. The chemical vapor deposition method of claim 28 wherein the microwave energy maximum power level duration increases as the deposited layer increases in thickness in the gap.

31. The chemical vapor deposition method of claim 28 wherein the microwave energy maximum power level duration gradually increases as the deposited layer increases in thickness in the gap.

32. The chemical vapor deposition method of claim 28 wherein the microwave energy is continuously supplied to the plasma chamber after the deposited layer has been initially deposited in the gap while the microwave energy is being pulsed.

33. The method of claim 28 wherein the duration and amplitude of the minimum power level are such as to maintain the electrons in the plasma at a temperature of at least 0.1 eV.

34. The method of claim 33 wherein the minimum power level is greater than zero.

35. A chemical vapor deposition method of depositing a layer on a workpiece in an electron cyclotron resonance vacuum plasma processor having a plasma chamber and a reaction chamber, the method comprising forming a plasma by supplying microwave energy and gases from a plasma source to the plasma chamber while at least one reacting gas is supplied to the reaction chamber, chemically reacting at least one element of the at least one reacting gas with at least one element in at least one of the gases of the plasma as derived from the plasma source to form the deposited layer on the workpiece, and repetitively pulsing the microwave energy supplied to the plasma chamber to maximum and minimum power levels while the gases from the plasma source and the reacting gas are in the reaction chamber, and controlling the maximum power level as a function of at least one material in the layer.

36. The chemical vapor deposition method of claim 35 further including controlling the minimum power level so the minimum power level is above zero, the minimum power level being controlled as a function of at least one material in the layer.

37. The method of claim 36 wherein the duration and amplitude of the minimum power level are such as to maintain the electrons in the plasma at a temperature of at least 0.1 eV.

38. A chemical vapor deposition method of depositing a layer on a workpiece in an electron cyclotron resonance vacuum plasma processor having a plasma chamber and a reaction chamber, the method comprising forming a plasma by supplying microwave energy and gases from a plasma source to the plasma chamber while at least one reacting gas is supplied to the reaction chamber, chemically reacting at least one element of the at least one reacting gas with at least one element in at least one of the gases of the plasma as derived from the plasma source to form the deposited layer on the workpiece, and repetitively pulsing the microwave energy supplied to the plasma chamber to maximum and minimum power levels while the gases from the plasma source and the reacting gas are in the reaction chamber, and controlling the minimum power level so the minimum power level is above zero, the minimum power level being controlled as a function of at least one material in the layer.

39. The chemical vapor deposition method of claim 38 wherein the layer is a dielectric and the minimum power level periods are long enough to cause electrons in the plasma on the deposited dielectric layer to be cooled sufficiently to reduce the tendency for opposite polarity charges to be established across the deposited dielectric layer and reduce the tendency for destructive Fowler-Nordheim tunneling current to flow across the deposited dielectric layer.

40. The method of claim 38 wherein the duration and amplitude of the minimum power level are such as to maintain the electrons in the plasma at a temperature of at least 0.1 eV.

41. A chemical vapor deposition method of depositing a layer on a workpiece in an electron cyclotron resonance vacuum plasma processor having a plasma chamber and a reaction chamber, the method comprising forming a plasma by supplying microwave energy and gases from a plasma source to the plasma chamber while at least one reacting gas is supplied to the reaction chamber, chemically reacting at least one element of the at least one reacting gas with at least one element in at least one of the gases of the plasma as derived from the plasma source to form the deposited layer on the workpiece, and repetitively pulsing the microwave energy supplied to the plasma chamber to maximum and minimum power levels while the gases from the plasma source and the reacting gas are in the reaction chamber, and controlling the average power level of the microwave energy as a function of at least one material in the layer.

42. The method of claim 41 wherein the duration and amplitude of the minimum power level are such as to maintain the electrons in the plasma at a temperature of at least 0.1 eV.

43. A chemical vapor deposition method of depositing a dielectric layer including a polymer having a dielectric constant less than about 3.5 on a workpiece in an electron cyclotron resonance vacuum plasma processor having a plasma chamber and a reaction chamber, the method comprising forming a plasma by supplying microwave energy and oxygen and an inert gas from a plasma source to the plasma chamber while a gaseous hydrocarbon is supplied to the reaction chamber, chemically reacting at least one element of the gaseous hydrocarbon with the oxygen of the plasma as derived from the plasma source to form the deposited polymer layer on the workpiece, and repetitively pulsing the microwave energy supplied to the plasma chamber to maximum and minimum power levels while the gases from the plasma source and the reacting gas are in the reaction chamber.

44. The chemical vapor deposition method of claim 43 wherein the layer is a dielectric and the minimum power level periods are long enough to cause electrons in the plasma on the deposited dielectric layer to be cooled sufficiently to reduce the tendency for opposite polarity charges to be established across the deposited dielectric layer and reduce the tendency for destructive current to flow across the deposited dielectric layer.

45. The chemical vapor deposition method of claim 43 wherein the layer is deposited in a gap having an initial aspect ratio of at least 1:1, the maximum and minimum power levels being such as to cause the gap to be bridged by a different deposited film each time the microwave energy is pulsed to the maximum and minimum power levels.

46. The method of claim 43 wherein the duration and amplitude of the minimum power level are such as to maintain the electrons in the plasma at a temperature of at least 0.1 eV.

* * * * *